United States Patent
Balasubramanian et al.

(10) Patent No.: US 10,700,586 B2
(45) Date of Patent: Jun. 30, 2020

(54) PREDRIVER SHORT PROTECTION

(71) Applicant: TEXAS INSTRUMENTS INCORPORATED, Dallas, TX (US)

(72) Inventors: Shyamsunder Balasubramanian, Plano, TX (US); Toshio Yamanaka, Plano, TX (US); Toru Tanaka, Plano, TX (US); Mayank Garg, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1 day.

(21) Appl. No.: 15/142,852

(22) Filed: Apr. 29, 2016

(65) Prior Publication Data
US 2017/0317619 A1    Nov. 2, 2017

(51) Int. Cl.
| | |
|---|---|
| H02P 29/02 | (2016.01) |
| H02P 6/08 | (2016.01) |
| H03K 5/134 | (2014.01) |
| H02P 6/12 | (2006.01) |
| H02M 1/08 | (2006.01) |
| H02M 1/32 | (2007.01) |
| H03K 17/12 | (2006.01) |
| H02P 29/024 | (2016.01) |
| H03K 17/0812 | (2006.01) |
| H03K 17/687 | (2006.01) |

(52) U.S. Cl.
CPC ............ *H02M 1/08* (2013.01); *H02M 1/32* (2013.01); *H02P 29/0241* (2016.02); *H03K 17/08122* (2013.01); *H03K 17/122* (2013.01); *H03K 17/6871* (2013.01)

(58) Field of Classification Search
CPC ... H02P 29/02; H02P 6/08; H02P 6/12; H03K 5/1534
USPC .......................................................... 318/504
See application file for complete search history.

(56) References Cited

U.S. PATENT DOCUMENTS

| | | | |
|---|---|---|---|
| 5,168,200 A * | 12/1992 | Payne ..................... G01F 1/26 251/129.11 |
| 8,174,214 B2 * | 5/2012 | Sells ..................... H02M 7/219 318/268 |
| 2006/0082944 A1 * | 4/2006 | Koyanagi ................ H02H 3/04 361/93.1 |
| 2011/0221370 A1 * | 9/2011 | Fukuta .................... H02M 1/32 318/400.27 |
| 2012/0146567 A1 * | 6/2012 | Iwaji ..................... H02P 29/02 318/504 |
| 2014/0266310 A1 * | 9/2014 | Shen .................... H03K 17/133 327/73 |

(Continued)

*Primary Examiner* — Cortez M Cook
(74) *Attorney, Agent, or Firm* — Lawrence J. Bassuk; Charles A. Brill; Frank D. Cimino

(57) ABSTRACT

A gate driver circuit includes a comparator and a gate driver. The comparator is configured to detect a short circuit in a first power field effect transistor (FET). The gate driver is configured to drive a gate of the first power FET by generating a first signal at a first drive current. In response to the comparator detecting a short circuit in the first power FET, the gate driver is further configured to pulse the first signal at a first pulldown current. After the pulse has ended, the gate driver is further configured to drive the gate of the first power FET at a first hold current. The first hold current is less than the first pulldown current.

15 Claims, 3 Drawing Sheets

(56) References Cited

U.S. PATENT DOCUMENTS

| | | | |
|---|---|---|---|
| 2014/0307492 A1* | 10/2014 | Suzuki | H02M 1/32 |
| | | | 363/56.01 |
| 2015/0349680 A1* | 12/2015 | Maeda | H02P 6/08 |
| | | | 318/400.06 |
| 2017/0248646 A1* | 8/2017 | Mauder | G01R 31/025 |

* cited by examiner

US 10,700,586 B2

PREDRIVER SHORT PROTECTION

BACKGROUND

In many applications, electric motors require large currents (i.e., greater than 100A) to operate. In many cases, special power field effect transistors (FETs) are utilized to drive these large currents. A gate driver circuit is utilized to control the power FETs operation. The gate driver circuit may include multiple gate drivers, one of which may drive a power FET by generating a signal at a drive current (i.e., a pull up current) to turn the power FET ON. Similarly, the gate driver may pulldown the current (at a pulldown current) to turn the power FET OFF. In this way, the gate driver circuit may control the operation of the power FETs. Sometimes, short circuits develop within the power FETs or in their physical wiring. In conventional systems, upon detection of a short circuit within a power FET, the gate drivers are configured to immediately generate the pulldown current for all of the power FETs of the system. This pulldown current is consistently provided to the gates of the power FETs until all of the power FETs are turned OFF. If the short circuit causes the power FET to connect to the power supply and the gate driver circuit continues to pulldown the gate of the power FET in response to these faults, the driver circuit will eventually burn up due to excessive power causing failure of the driver chip.

SUMMARY

The problems noted above are solved in large part by systems and methods for protecting a gate driver circuit from a short circuit. In some embodiments, a gate driver circuit includes a comparator and a gate driver. The comparator is configured to detect a short circuit in a first power field effect transistor (FET). The gate driver is configured to drive a gate of the first power FET by generating a first signal at a first drive current (i.e., generating an ON or OFF signal at the first drive current). In response to the comparator detecting a short circuit between any of the terminals of the first power FET, the gate driver is further configured to pulse the gate of the first power FET at a first pulldown current. After the pulse has ended, the gate driver is further configured to drive the gate of the first power FET at a first hold current. The first hold current is less than the first pulldown current.

Another illustrative embodiment is a control system that includes a microcontroller (MCU), a first power FET, and a gate driver circuit coupled to the MCU and the first power FET. The MCU is configured to implement state changes for the control system. The first power FET is configured to drive an electric motor. The gate driver circuit is configured to drive a gate of the first power FET by generating a first signal at a drive current. In response to a short circuit in the first power FET, the gate driver circuit is further configured to pulse the first signal at a first pulldown current. After the pulse has ended, the gate driver circuit is further configured to drive the gate of the first power FET at a first hold current. The first hold current is less than the first pulldown current.

Yet another illustrative embodiment is a method for protecting gate driver circuits from short circuits. The method includes driving a gate of a first power FET at a drive current. The method also includes detecting a short circuit in the first power FET. In response to detecting the short circuit, the method also includes pulsing a first signal to the gate of the first power FET at a first pulldown current. In response to an ending of the pulse signal, the method includes driving the gate of the first power FET at a first hold current.

BRIEF DESCRIPTION OF THE DRAWINGS

For a detailed description of various examples, reference will now be made to the accompanying drawings in which.

NOTATION AND NOMENCLATURE

Figure 1:
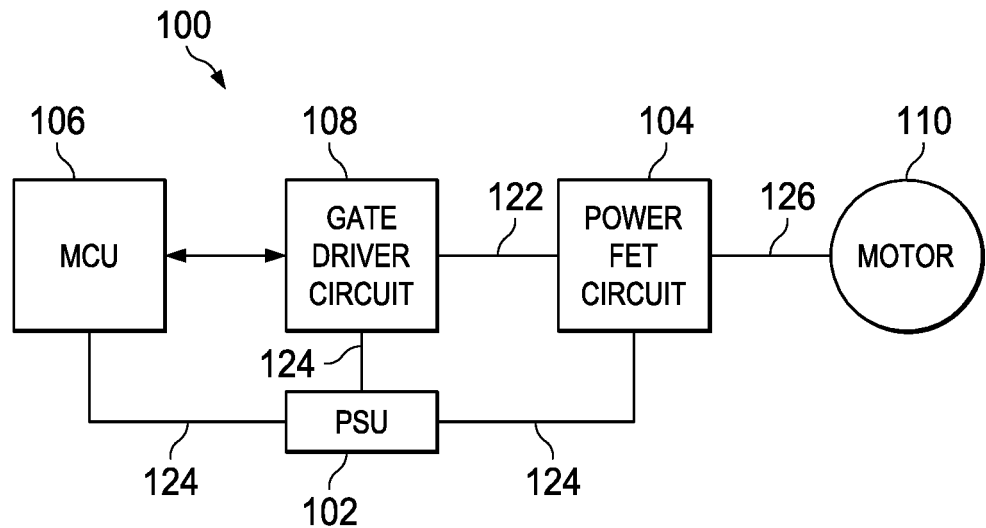
FIG. 1 shows an illustrative block diagram of a control system in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

In many systems, power field effect transistors (FETs) are utilized to drive large currents to control electrical motors. Gate drivers typically control the operation of these power FETs. A gate driver may drive a power FET by generating a signal at a drive current (i.e., a pull up current) to turn the power FET ON. Similarly, the gate driver may pulldown the current (at a pulldown current) to turn the power FET OFF. In this way, the gate driver circuit may control the operation of the power FETs. Sometimes, short circuits develop within the power FETs. In conventional systems, upon detection of a short circuit within a power FET, the gate drivers are configured to immediately generate the pulldown current (sometimes around 1A) for all of the power FETs of the system. This pulldown current is consistently provided to the gates of the power FETs until all of the power FETs are turned OFF. However, in certain situations the gate of one of the power FETs may short to the supply power of the system which provides high voltage (e.g., 24V). Thus, the pulldown current may not be adequate to overcome the short circuit and the power FET may remain ON. In the conventional system, while the short circuit remains, the gate driver continues to generate the pulldown current in an attempt to pulldown the power FET, even if the short circuit cannot be overcome. Thus, while the gate driver is continuously attempting to sink a pulldown current (around 1A), many of the electrical components may be destroyed due to the buildup of excessive heat. Therefore, it is desirable to design a safety system that enables a pulldown of power FETs when a short circuit is detected, but if the short circuit cannot be overcome, does not destroy additional electronic components.

In accordance with the disclosed principles, once a short circuit is detected in a power FET of the system, the gate driver may be configured to pulse the pulldown current to rapidly pulldown all of the power FETs. However, the pulse provides the pulldown current only for a predetermined (sometimes brief) period of time. Thus, if the short circuit cannot be overcome, the gate driver is not indefinitely attempting to sink the pulldown current. Once the pulse has ended, the gate driver is configured to generate a smaller (e.g., 30 mA) hold current to be provided to the gates of the power FETs. This keeps the system floating while not generating the excessive heat that may destroy additional electronic components. Furthermore, if the short circuit is ever overcome, this hold current may eventually pulldown (i.e., turn OFF) the effected power FET. Thus, these external power FETs are shutdown rapidly when needed (i.e., during phase short circuits) while avoiding damage due to excessive heat (due to gate to supply power short circuits).

FIG. 1 shows an illustrative block diagram of control system 100 in accordance with various embodiments. Control system 100 may comprise power supply unit (PSU) 102, power FET circuit 104, microcontroller (MCU) 106, gate driver circuit 108 and motor 110. In some embodiments, control system 100 is configured to control the driving of motor 110. While the control system 100 depicted in FIG. 1 is configured to control motor 110, in alternative embodiments, control system 100 may be configured to control any type of device including any type of circuit.

PSU 102 may be any type of electrical device configured to generate a power supply 124 at a given voltage (e.g., 24V) to provide electric energy for the remaining components of control system 100 (i.e., power FET circuit 104, MCU 106, gate driver circuit 108) to operate. PSU 102 may any type of power supply including a DC power supply, an AC-to-DC power supply, a linear regulator, an AC power supply, a switched-mode power supply, an uninterruptible power supply (UPS), a battery, etc.

Because the power supply supplied by PSU 102 may be too high to directly power some components, in some embodiments, one or more voltage regulators (not shown) are configured to receive the power supplied by PSU 102 and generate an output signal at a constant voltage to directly power other components of control system 100 (e.g., MCU 106 and gate driver circuit 108 which may be integrated on the same integrated circuit). These one or more voltage regulators may be low-dropout (LDO) regulators, DC-DC Buck converters, etc. For example, the voltage regulators may receive power supplied by PSU 102 at 24V and generate output signals to supply power to other components of system 100 at a steady 5-6V.

MCU 106 may be configured to implement state changes for the devices of control system 100. For example, MCU 106 may be configured to control the overall operation of the control system 100 by implementing state changes for gate driver circuit 108. MCU 106 may be any type of microcontroller or other electrical processing device and may include a processor core, memory, and programmable input/output peripherals. The memory of MCU 106 may be in the form of flash, read-only memory, random access memory, or any other type of memory or combination of types of memory. The components of MCU 106 may be implemented as a system on a chip (SoC) on a single integrated circuit. In alternative embodiments, MCU 106 may be implemented across multiple integrated circuits.

Gate driver circuit 108 may be configured to drive electric motor 110 in response to signals received from MCU 106. In other words, gate driver circuit 108 may drive electric motor 110 based on the state changes in the gate driver circuit 108 imposed by MCU 106. In some embodiments, large currents (e.g., hundreds of amps) are needed to drive electric motor 100. Therefore, power FET circuit 104, which in some embodiments is not implemented on the same integrated circuit as the MCU 106 and the gate driver circuit 108 but instead in the same package (a multi-chip module), is utilized to drive the electric motor 110. More particularly, gate driver circuit 108 may be configured to drive the gates of power FETs within power FET circuit 104 by generating signal 122 at a drive current (e.g., to turn ON and OFF the power FETs within power FET circuit 104). In other words, gate driver circuit 108 may generate signal 122 with a current that has a magnitude sufficient to drive the gates of the power FETs within power FET circuit 104. While shown as a single signal, signal 122 may be multiple signals. For example, gate driver circuit 108 may generate as many drive signals as there are power FETs within power FET circuit 104 (e.g., six signals 122 to drive the gates of six power FETs).

The power FETs within power FET circuit 104 then may drive the electric motor 110 with the current to operate the electric motor 110 by generating signal 126. Electric motor 110 may be any type of electric motor including a brushless DC electric motor, and more particularly a stepper motor. For example, electric motor 110 may be a three phase brushless DC motor. Because electric motor 110 may be a three phase electric motor, power FET circuit 104 may generate three signals 126 to drive each phase of the electric motor 110. In some embodiments, control system 100 may be implemented in automobiles. For example, control system 100 may be utilized to control the power steering of an automobile. In other embodiments, control system 100 may be implemented in other control systems.

Figure 2:
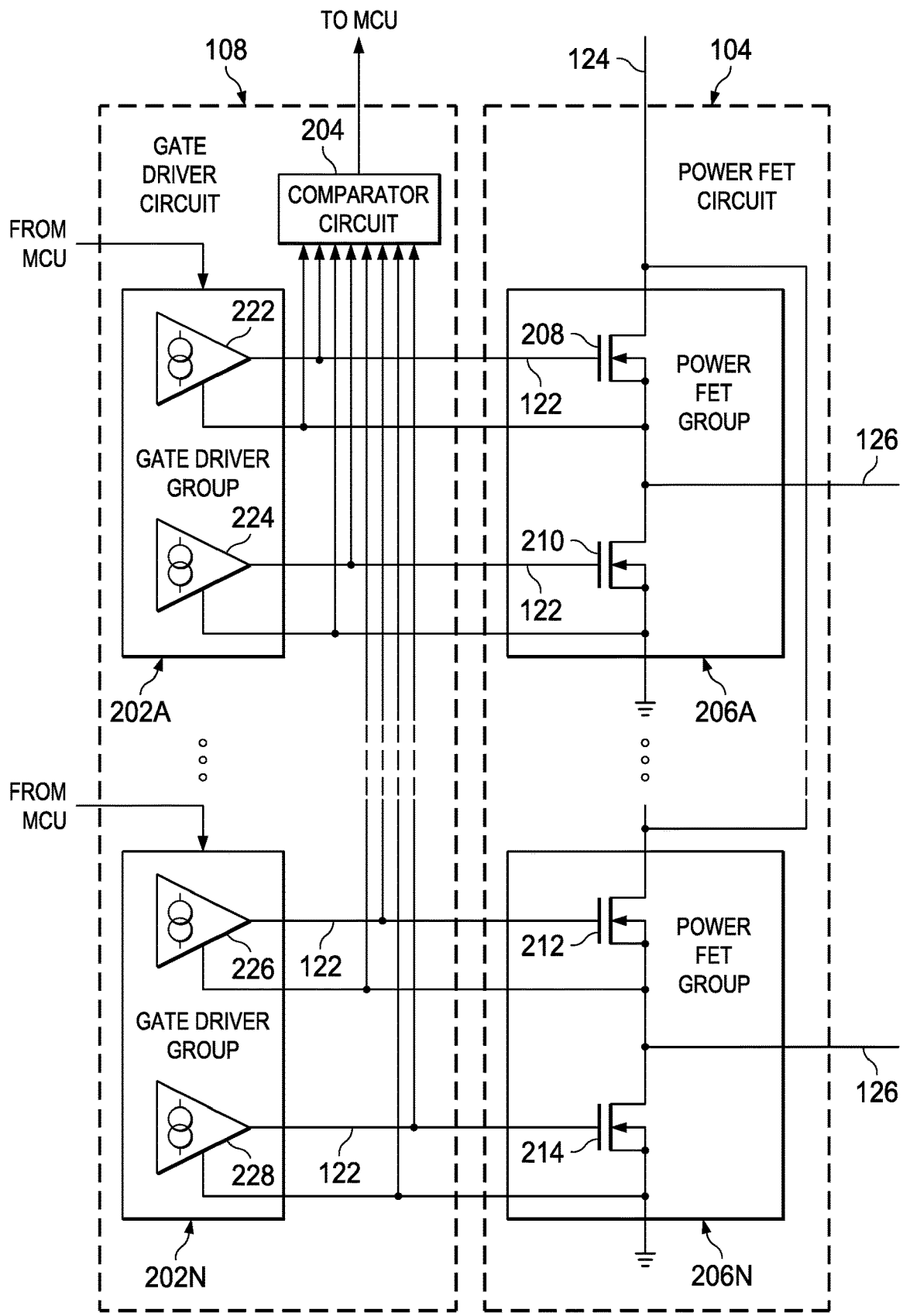
FIG. 2 shows an illustrative block diagram of a gate driver circuit and a power FET circuit in accordance with various embodiments.

FIG. 2 shows an illustrative block diagram of gate driver circuit 108 and power FET circuit 104 in accordance with various embodiments. Gate driver circuit 108 may include gate driver groups 202A-N and comparator circuit 204. Power FET circuit 104 may include power FET groups 206A-N. The ellipsis between the gate driver groups 202A and 202N and between the power FET groups 206A-N indicates that there may be any number of gate driver groups 202A-N and/or power FET groups 206A-N, although, for clarity, only two of each are shown. In some embodiments, there are three power FET groups 206A-N each configured to generate a signal 126 to drive a single phase of electric motor 110. Similarly, in some embodiments, there are three gate driver groups 202A-N each configured to drive the gates of the power FETs included in a single power FET group 206A-N (e.g., gate driver group 202A drives the gates of the power FETs included in power FET group 206A and gate driver group 202N drives the gates of the power FETs included in power FET group 206N).

Each power FET group 206A-N may include two power FETs (e.g., power FETs 208-210 within power FET group 206A and power FETs 212-214 within power FET group 206N). Furthermore, the power FETs 208-214 of each power FET group 206A-N may be arranged in a high side/low side configuration. For example, power FET 208 may be the high side power FET for power FET group 206A while power FET 210 is the low side power FET. Similarly, power FET 212 may be the high side power FET for power FET group 206N while power FET 214 is the low side power FET. Each high side power FET (e.g., power FETs 208 and 212) may receive the power supply 124 from PSU 102. The power FETs 208-214 may each be a FET and more particularly may be an n-channel metal-oxide semiconductor field-effect (NMOS) transistor. In alternative embodiments, power FETs 208-214 may be any other type of transistor including a p-channel metal-oxide-semiconductor field-effect (PMOS) transistor, a p-type junction gate field-effect transistor (PJFET), a n-type junction gate field-effect transistor (NJFET), and a bipolar junction transistor (BJT) (including PNP and NPN transistors).

Each gate driver group 202A-N may include two gate drivers (e.g., gate drivers 222-224 within gate driver group 202A and gate drivers 226-228 within gate driver group 202N). Each gate driver 222-228 may be configured to drive a single power FET 208-214, in some embodiments, in response to signals from MCU 106. For example, gate driver 222 may be configured to drive power FET 208, gate driver 224 may be configured to drive power FET 210, gate driver 226 may be configured to drive power FET 212, and gate driver 228 may be configured to drive power FET 214. In addition to driving the gates of the power FETs 208-214, the gate drivers 222-228 may also drive the sources of the power FETs 222-228. For example, in addition to generating signal 122 at the drive current to drive the gate of power FET 208, gate driver 222 may generate a signal to drive the source of power FET 208 as well. In this way, the gate driver circuit 108 may drive the power FET circuit 104 to drive the electric motor 110.

Comparator circuit 204 may be any type of comparator circuit including an operational amplifier comparator. Comparator circuit 204 may be configured to detect short circuits within the power FETs 208-214 including a short of the gate of any power FET 208-214 to power supply 124. More specifically, comparator circuit 204 may be configured to compare the gate-to-source voltage of each power FET 208-214 and/or the drain-to-source voltage of each power FET 208-214. Based on this comparison, a short circuit may be detected.

To protect the components of system 100, in response to comparator circuit 204 detecting a short circuit in any of power FETs 208-214, gate drivers 222-228 may be configured to pulse signal 122 to their corresponding power FET 208-214 at a pulldown current. For example, if comparator circuit 204 detects a short circuit in power FET 208, gate driver 222 is configured to pulse signal 122 at a pulldown current (i.e., a current that is configured to turn OFF power FET 208). In other words, gate driver 222 is configured to generate a signal at the pulldown current, which in some embodiments is 1A, for a predetermined amount of time. In some embodiments, the comparator circuit 204 may transmit and/or send the comparison to MCU 106 for processing, and the MCU 106 may transmit a signal instructing the gate driver 222 to generate the signal at the pulldown current. In response to a detected short circuit in power FET 208, the gate drivers 224-226 may also pulse signal 122 to their respective power FETs 210-214 at their respective pulldown currents. Similarly, if comparator circuit 204 detects a short circuit in power FET 210, gate driver 222 may be configured to pulse signal 122 at a pulldown current in an attempt to turn OFF power FET 208, and the remaining gate drivers 224-228 may also be configured to pulse signal 122 to their respective power FETs 210-214 at their respective pulldown currents. In some embodiments, the pulldown current for each of power FETs 208-214 is the same; however, in alternative embodiments, the pulldown current for power FETs 208-214 may be different for some or all of the power FETs 208-214. Additionally, the magnitude of the pulldown current and the duration of the pulse for each of power FETs 208-214 may be programmable in the MCU 106.

Because the power supply 124 is a relatively high voltage, when the short of any of power FETs 208-214 is from gate to supply, the pulldown current may not overcome the supply. Thus, the power FET with the gate to supply short may not pulldown and turn OFF even after a long period of receiving the pulldown current. The longer the pulldown current is applied to the gate of the power FET 208-214 with the short from gate to supply, the higher the likelihood of destroying other components of system 100 due to excessive heat. As discussed previously, the duration of the pulse for each of power FETs 208-214 may be programmable in the MCU. That duration may be based on how long the pulldown current may be applied to one of the power FETs 208-214 before other components of system 100 begin to fail.

In order to protect the gate driver circuit 108 and MCU 106, once the pulse generated by the gate drivers 222-228 has ended (i.e., once the predetermined amount of time that the pulldown current is provided to the power FETs 208-214 is over), the gate drivers 222-228 may generate a hold current that is provided as part of signal 122 to the gates of power FETs 208-214. For example, if the gate of power FET 208 is shorted to power supply 124, a pulldown current is pulsed to each the power FETs 208-214. Once the pulse ends, the hold current is provided to each of the gates of power FETs 208-214. The magnitude of the hold current for each of the power FETs 208-214 may be less than, and in some embodiments, much less than the magnitude of the pulldown current. For example, while the magnitude of the pulldown current may be 1A, the magnitude of the hold current may be 30 mA. In some embodiments, the hold current for each of power FETs 208-214 is the same; however, in alternative embodiments, the hold current for power FETs 208-214 may be different for some or all of the power FETs 208-214. Additionally, the magnitude of the hold current may be programmable in the MCU 106 and may be low enough such that, when combined with a gate shorted to supply in one of the power FETs 208-214, the gate driver circuit 108 and/or the MCU 106 are not destroyed. While the magnitude of the hold current is less than the magnitude of the pulldown current, it does provide enough current to the gate of any of power FETs 208-214 to pulldown (i.e., turn OFF) the power FET if the short circuit is resolved (it will just take longer to pulldown the power FET than if the magnitude of the pulldown current is utilized).

Figure 3:
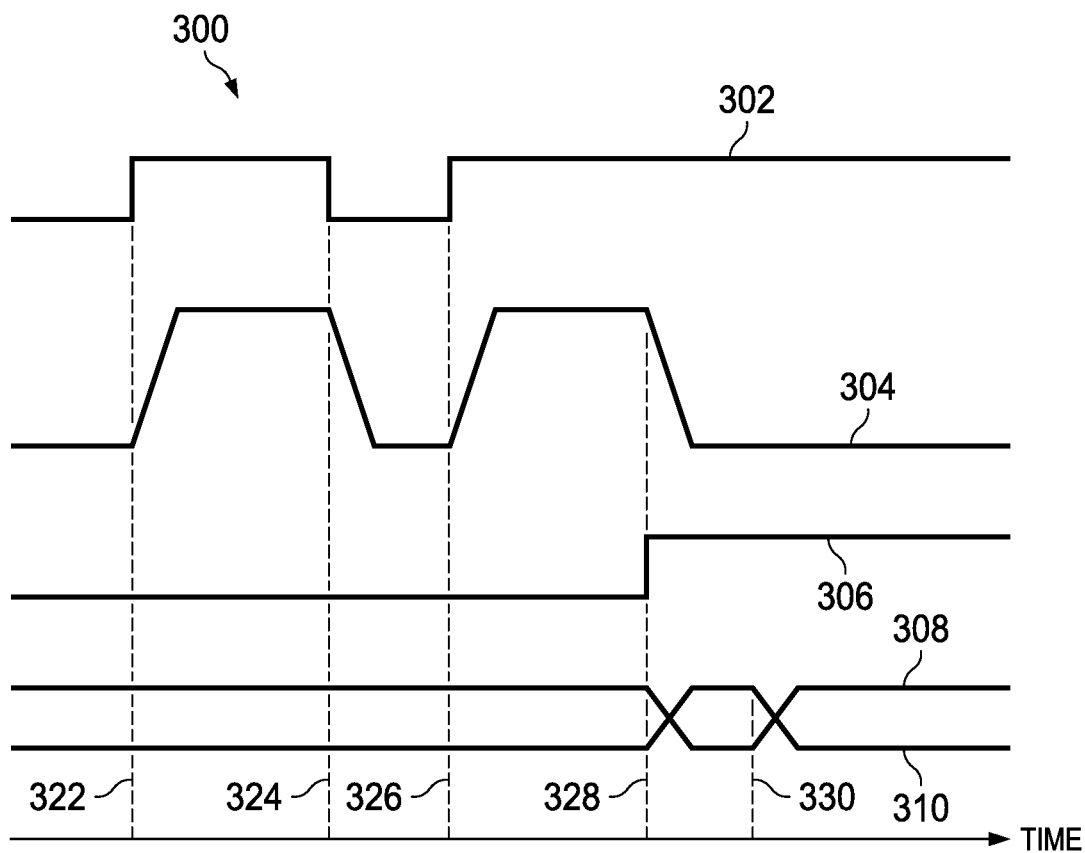
FIG. 3 shows an illustrative signal to a power FET versus time graph in accordance with various embodiments.

FIG. 3 shows an illustrative signal to a power FET versus time graph 300 in accordance with various embodiments. Line 302 depicts an input signal from the MCU 106 to gate driver circuit 108 to generate a drive current to turn ON and OFF any of power FETs 208-214. For example, line 302 is LOW until time 322 when it goes HIGH indicating that the input signal is requesting that one of the power FETs 208-214 is to turn ON. In this example, assuming the input signal is utilized to control power FET 208, at time 322, the gate driver circuit 108 may send signal 122 to power FET 208 at the drive current, turning power FET 208 ON. At time 324, line 302 goes LOW, indicating that the input signal is requesting that power FET 208 turn OFF. This causes the gate driver circuit 108 to send signal 122 at the pulldown current to power FET 208 turning power FET 208 OFF. At time 326, line 302 turns HIGH again indicating that the input signal is requesting that one of power FET 208 is to turn ON which causes the gate driver circuit 108 to send signal 122 at the drive current to power FET 208 turning power FET 208 ON.

Line 304 depicts the gate-to-source voltage of, continuing the previous example, the power FET 208. Prior to time 322, the gate-to-source voltage of power FET 208 is 0V. When line 302 turns HIGH at time 322, the gate-to-source voltage of power FET 208 ramps up because power FET 208 receives signal 122 at the drive current. At time 324, line 302 turns LOW which causes the pulldown of power FET 208 so that the gate to source voltage ramps down to 0V. When line 302 turns HIGH at time 326, the gate-to-source voltage of power FET 208 ramps up again.

Line 306 depicts a fault signal which may be generated by MCU 106 based on the comparator 204 detecting a short circuit in any of power FETs 208-214. As shown in the example in FIG. 3, at time 328, the fault signal, as shown by line 306, goes HIGH indicating that there is a short circuit in one of power FETs 208-214. Therefore, at time 328, the gate drivers 222-228 may generate a pulse at the pulldown current to rapidly turn OFF all of the power FETs 208-214. Thus, line 304 shows that the gate-to-source voltage of power FET 208 ramps down to 0V. Furthermore, lines 308-310 depict the current setting being generated by gate drivers 222-228. Prior to time 328, the system 100 is operating in a normal condition setting. In other words, gate drivers 222-228 are generating signal 122 at drive current and the pulldown current in normal configuration. Between times 328-330, the gate drivers 222-228 are generating the pulse at the pulldown current to rapidly turn OFF all of the power FETs 208-214. However, if any of the power FETs 222-228 are shorted from gate to supply, the pulse may not turn off that particular power FET even at the pulldown current. Thus, after time 330, the gate drivers 222-228 generate the signal 122 at the hold current to protect the MCU 106 and the gate driver circuit 108 from excessive, damaging heat buildup.

Figure 4:
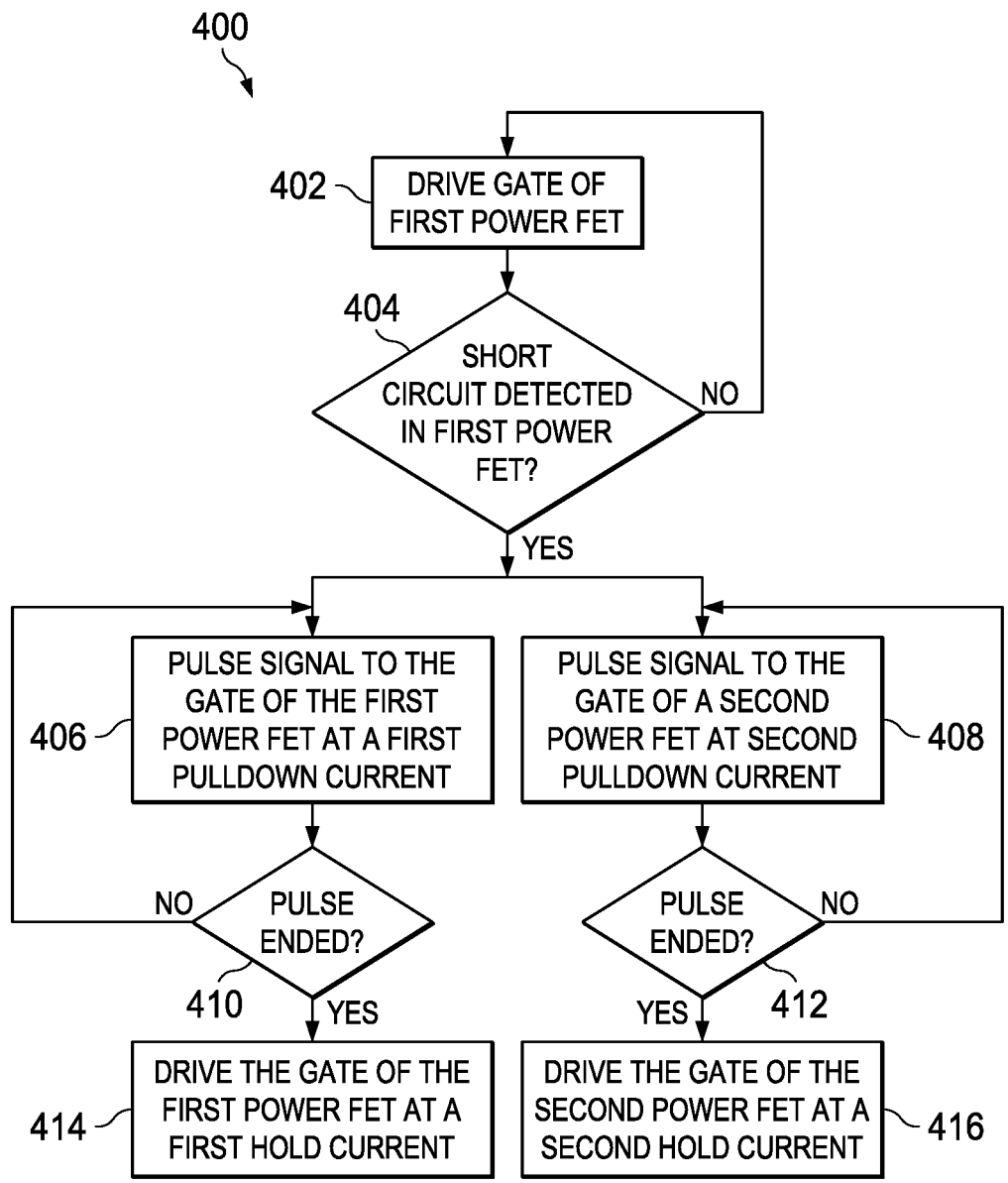
FIG. 4 shows an illustrative flow diagram of a method for protecting gate driver circuits from short circuits in accordance with various embodiments.

FIG. 4 shows an illustrative flow diagram of a method 400 for protecting gate driver circuits from short circuits in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 400, as well as other operations described herein, can be performed by MCU 106, gate driver circuit 108, and/or power FET circuit 104 and implemented by a processor executing instructions stored in a non-transitory computer readable storage medium.

The method 400 begins in block 402 with driving the gate of a first power FET, such as power FET 208. In some embodiments, the gate of the first power FET is driven by a gate driver, such as gate driver 222, at a drive current. In block 402, the method 400 continues with determining whether a short circuit has been detected in the first power FET. For example, a comparator, such as comparator 204, may be utilized to compare the gate-to-source voltage of power FET 208 and/or the drain-to-source voltage of power FET 208 to determine whether there is a short circuit in power FET 208. If in block 404, a determination is made that a short circuit has not been detected in the first power FET, the method 400 continues in block 402 with driving the gate of the first power FET.

If in block 404, a determination is made that a short circuit has been detected in the first power FET, the method 400 continues in blocks 406 and 408. In block 406, a signal is pulsed to the gate of the first power FET at a first pulldown current. For example, signal 122 may be pulsed for a predetermined, programmable amount of time at a pulldown current to pulldown the first power FET and turn it OFF. Similarly, in block 408 a signal is pulsed to the gate of a second power FET, such as power FET 210, at a second pulldown current. For example, signal 122 may be pulsed for a predetermined, programmable amount of time at a pulldown current to pulldown the second power FET and turn it OFF. The first and second pulldown currents may be equal in magnitude.

The method 400 continues in block 410 with determining whether the pulse for the first power FET has ended. If in block 410, a determination is made that the pulse has not ended, the method 400 continues in block 406 with the pulsing of the gate of the first power FET. However, if in block 410, a determination is made that the pulse has ended, the method 400 continues in block 414 with driving the gate of the first power FET at a first hold current.

In block 412 with determining whether the pulse for the second power FET has ended. If in block 412, a determination is made that the pulse has not ended, the method 400 continues in block 408 with the pulsing of the gate of the second power FET. However, if in block 412, a determination is made that the pulse has ended, the method 400 continues in block 416 with driving the gate of the second power FET at a second hold current. The first hold current and the second hold may be equal in magnitude.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. Field effect transistor gate driver circuitry comprising:
   a first control input;
   a first gate driver having a driver control input coupled to the first control input, a first gate output, and a first source output;
   comparator circuitry having a first input coupled to the first gate output, a second input coupled to the first source output, and a comparator output;
   a second gate driver having a second driver input coupled to the first control input, a second gate output, and a second source output;
   the comparator circuitry having a third input coupled to the second gate output, and a fourth input coupled to the second source output;
   a second control input:
   a third gate driver having a third driver input coupled to the second control input, a third gate output, and a third source output; and the comparator circuitry having a fifth input coupled to the third gate output, and a sixth input coupled to the third source output.

2. The field effect transistor gate driver circuitry of claim 1 including:
a fourth gate driver having a fourth driver input coupled to the second control input, a fourth gate output, and a fourth source output; and
the comparator circuitry having seventh input coupled to the fourth gate output, and an eighth input coupled to the fourth source output.

3. The field effect transistor gate driver circuitry of claim 2 including a microcontroller unit having a comparator input coupled to the comparator output, a first output coupled to the first control input, and a second output coupled to the second control input.

4. The field effect transistor gate driver circuitry of claim 2 including an integrated circuit carrying the first, second, third, and fourth gate drivers, and the comparator circuitry.

5. The field effect transistor gate driver circuitry of claim 3 including an integrated circuit carrying the first, second, third, and fourth gate drivers, the comparator circuitry, and the microcontroller unit.

6. A control system comprising:
a power supply unit;
field effect transistor circuitry including a first transistor with a first gate, a first source, and a first drain, and a second transistor having a second gate, a second source and a second drain, the drains and sources of the first and second transistors being coupled in series to the power supply unit, and there being a first drive signal output between the first and second transistors;
a microcontroller unit having a comparator input and a first driver output;
gate driver circuitry including a first gate driver group including:
a first driver input coupled to the first driver output;
a first gate driver having a first gate output coupled to the first gate of the first transistor and a first source output coupled to the first source of the first transistor;
a second gate driver having a second gate output coupled to the second gate of the second transistor and a second source output coupled to the second source of the second transistor; and
comparator circuitry having a first input coupled to the first gate output, a second input coupled to the first source output, a third input coupled to the second gate output, a fourth input coupled to the second source output, and a comparator output coupled to the comparator input of the microcontroller unit; and
a load having a first drive signal input coupled to the first drive signal output.

7. The control system of claim 6 in which the load is a motor.

8. The control system of claim 6 in which the first source of the first transistor is coupled in series to the second drain of the second transistor and the drive signal output is coupled to the first source of the first transistor and the second drain of the second transistor.

9. The control system of claim 6 in which:
the field effect transistor circuitry includes a third transistor with a third gate, a third source, and a third drain, and a fourth transistor having a fourth gate, a fourth source and a fourth drain, the drains and sources of the third and fourth transistors being coupled in series to the power supply unit in parallel with the first and second transistors, and there being a second drive signal output between the third and fourth transistors;
the microcontroller unit having a second driver output;
the gate driver circuitry including a second gate driver group including:
a second driver input coupled to the second driver output;
a third gate driver having a third gate output coupled to the third gate of the third transistor and a third source output coupled to the third source of the third transistor;
a fourth gate driver having a fourth gate output coupled to the fourth gate of the fourth transistor and a fourth source output coupled to the fourth source of the fourth transistor; and
the comparator circuitry having a fifth input coupled to the third gate output, a sixth input coupled to the third source output, a seventh input coupled to the fourth gate output, and an eighth input coupled to the fourth source output; and
the load having a second drive signal input coupled to the second drive signal output.

10. The control system of claim 9 including an integrated circuit carrying the gate driver circuitry.

11. The control system of claim 9 including an integrated circuit carrying the gate driver circuitry and the microcontroller unit.

12. The field effect transistor gate driver circuitry of claim 1 in which the first gate output is adapted to be coupled to a gate of a first power transistor, and the first source output is adapted to be coupled to the source of the first power transistor.

13. The field effect transistor gate driver circuitry of claim 1 in which the second gate output is adapted to be coupled to a gate of a second power transistor, and the second source output is adapted to be coupled to the source of the second power transistor.

14. The field effect transistor gate driver circuitry of claim 1 in which the third gate output is adapted to be coupled to a gate of a third power transistor, and the third source output is adapted to be coupled to the source of the third power transistor.

15. The field effect transistor gate driver circuitry of claim 2 in which the fourth gate output is adapted to be coupled to a gate of a fourth power transistor, and the fourth source output is adapted to be coupled to the source of the fourth power transistor.

* * * * *